United States Patent [19]
Kuwashiro

[11] Patent Number: 5,945,984
[45] Date of Patent: *Aug. 31, 1999

[54] DISPLAY DEVICE AND METHOD OF INSPECTING SAME

[75] Inventor: Katsuaki Kuwashiro, Tokyo, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/562,592

[22] Filed: Nov. 24, 1995

[30] Foreign Application Priority Data

Nov. 24, 1994 [JP] Japan .................................. 6-289323
Oct. 20, 1995 [JP] Japan .................................. 7-272628

[51] Int. Cl.⁶ .................................................. G09G 5/00
[52] U.S. Cl. ........................................................ 345/206
[58] Field of Search ............................. 345/87, 98, 100, 345/103, 104, 206, 205, 204; 349/149, 150, 139, 152; 324/765, 770, 527, 537

[56] References Cited

U.S. PATENT DOCUMENTS 5,349,226  9/1994  Kawaguchi et al. .................. 349/152
5,453,991  9/1995  Suzuki et al. ......................... 324/770
5,473,261 12/1995  Marumoto et al. .................... 324/770

*Primary Examiner*—Chanh Nguyen
*Attorney, Agent, or Firm*—Pillsbury Madison & Sutro LLP

[57] ABSTRACT

There is disclosed a display device comprising a display panel having plural a plurality of pixel elements, plural driver circuit elements for receiving a serially input image signal, converting the signal into a parallel form, and then sending the converted signal to the display panel, and a printed-wiring board. This printed-wiring board has a plurality of signal output terminals for delivering the serial image signal and control signals to the driver circuit elements. The printed-wiring board further includes dummy output terminals close to the signal output terminals. One of the dummy terminals is electrically connected with one signal output terminal within the printed-wiring board. Another dummy terminal is electrically connected with another signal output terminal within the printed-wiring board. Thus, an inspection can be performed easily. Furthermore, the cause of a defect in the displayed image can be readily identified. Hence, the time taken to repair the device can be shortened.

18 Claims, 4 Drawing Sheets

DISPLAY DEVICE AND METHOD OF INSPECTING SAME

BACKGROUND OF THE INVENTION a. Field of the Invention

The present invention relates to a display device comprising a plurality of pixel elements and also to a method of inspecting such a display device.

b. Description of the Prior Art

Display devices typified by liquid crystal displays have several features, i.e., they have reduced device depth, are lightweight, and have low electric power consumption. By making use of these features, these display devices are used as displays for personal computers and word processors. Furthermore, these display devices are used as TV displays and as projection displays. In this way, display devices of this kind are used in various applications.

Among these display devices, an active matrix liquid crystal display having switching devices electrically connected with pixels has been earnestly researched and developed, because this liquid crystal display can accomplish good image quality, i.e., no crosstalk is produced between adjacent pixels.

The active matrix liquid crystal display comprises a liquid crystal panel consisting of a plurality of pixels, together with an X-driver circuit portion for supplying an analog image signal to the individual pixels of the liquid crystal panel. For example, this X-driver circuit portion comprises an X-printed wiring board and an X TAB (tape automated bonding) chip consisting of a signal line-driving IC installed on a flexible sheet. The X printed-wiring board supplies serial image data of several bits and a control signal to the X TAB chip. The output terminals of the X TAB chip are connected with the signal lines of the display panel via an anisotropic conductive film or the like. The input terminals of the X TAB chip are soldered or otherwise connected to the X printed-wiring board. The X-driving circuit portion converts serially input image data successively into a parallel form. The obtained digital signal is converted into an analog form. The resulting signal is changed into analog image signals for their respective pixels and supplied to the liquid crystal panel.

The active matrix liquid crystal display is further equipped with a Y-driver circuit portion for selecting the pixels on the display panel for each row. This Y-driver circuit portion also includes a Y TAB chip consisting of a Y-driving IC installed on a flexible film and a Y printed-wiring board for supplying control signals to the Y TAB chip. The output terminals of the Y TAB chip are connected with the display panel via an anisotropic conductive film or the like. The input terminals of the Y TAB chip are soldered or otherwise connected to the Y printed-wiring board.

c. Objects of the Invention

After the above-described display device has been completed, it is necessary to inspect it to ensure product quality. For example, the display device conveys a certain image which is visually or otherwise checked. In this way, one judges whether the finished product is acceptable or not. If the display device has a defect that can be remedied by exchanging one of the driving ICs, one of the printed-wiring boards, or other part with another, then the defective part is replaced. In this manner, the display device is repaired.

Although defects in the display panel or driving circuit portions of the prior art display devices could be identified by the state of the displayed image it has been difficult to ascertain the source of the defect, i.e., which of the driving ICs, the printed-wiring boards, and other driving circuit boards, is responsible for the defect. Therefore, it has taken very long time to repair the display device.

SUMMARY OF THE INVENTION

The present invention has been made to cope with the foregoing technical difficulty.

It is an object of the present invention to provide a display device which can be easily inspected and repaired in a relatively short time.

The invention as set forth in claim 1 is a display device having a display panel, a plurality of driver circuit elements for receiving a serial image signal, converting the image signal into a parallel form, and sending the signal to the display panel, and a printed-wiring board including a plurality of signal output terminals for delivering the serial image signal and control signals to the driver circuit elements. The display panel has a plurality of pixel elements. The display device is characterized in that printed-wiring board is equipped with a plurality of dummy output terminals close to the output terminals. A first dummy output terminal included in the first-mentioned dummy output terminals is electrically connected with a first one of the signal output terminals of the printed-wiring board. A second dummy output terminal included in the first-mentioned dummy output terminals is electrically connected with a second one of the signal output terminals of the printed-wiring board.

The driver circuit elements of the display device further comprise driving ICs installed on a flexible sheet and have signal input terminals and dummy input terminals. The signal input terminals correspond to the signal output terminals of the printed-wiring board. The dummy input terminals correspond to the dummy output terminals. The dummy output terminals are located between sides of the signal output terminals and their respective adjacent flexible sheets.

In addition, the driver circuit elements are installed on the display panel. This display panel has signal input terminals corresponding to the signal output terminals of the printed-wiring board and dummy input terminals corresponding to the dummy output terminals.

The dummy output terminals are made larger than the signal output terminals.

The invention is also a display device having a display panel, a plurality of driver circuit elements for supplying scanning pulses to the display panel, and a printed-wiring board including signal output terminals for delivering control signals to the driver circuit elements. The display panel has plural a plurality of pixel elements. The printed-wiring board has a plurality of dummy output terminals located close to the signal output terminals. The dummy output terminals include one output terminal electrically connected with one of the signal output terminals within the printed-wiring board. The dummy output terminals include another output terminal electrically connected with another of the signal output terminals within the printed-wiring board.

The invention is also a display device having a display panel, a plurality of driver circuit elements for supplying scanning pulses to the display panel, and a printed-wiring board including a plurality of signal output terminals for delivering control signals to the driver circuit elements. The display panel has plural a plurality of pixel elements. This display device is characterized in that the printed-wiring board is equipped with one or more dummy output terminals at each side of the signal output terminals. A first dummy output terminal included in the first-mentioned dummy output terminals is electrically connected with a first one of the signal output terminals within the printed-wiring board. A second dummy output terminal included in the first-mentioned dummy output terminals is electrically connected with a second one of the signal output terminals within the printed-wiring board.

This display device is characterized in that the driver circuit elements comprise driving ICs installed on a flexible sheet and have signal input terminals corresponding to the signal output terminals of the printed-wiring board and dummy input terminals corresponding to the dummy output terminals.

The driver circuit elements are installed on the display panel and arranged along one side of the display panel. The dummy output terminals are located between sides of the signal output terminals and their respective adjacent signal output terminals of the driver circuit elements.

The invention is also a method of inspecting a display device. The display device has a display panel equipped with a plurality of pixel elements, a plurality of driver circuit elements for receiving a serial image signal, converting the image signal into a parallel form, and sending the converted signal to the display panel, and a printed-wiring board including a plurality of signal output terminals for delivering the serial image signal and control signals to the driver circuit elements. The printed-wiring board is equipped with a plurality of dummy output terminals close to the signal output terminals. The dummy output terminals include one output terminal electrically connected with one of the signal output terminals within the printed-wiring board. The dummy output terminals further include another output terminal electrically connected with another of the signal output terminals within the printed-wiring board. An inspecting appliance is made to abut against the dummy output terminals to inspect the display device for presence or absence of flow of a signal.

The invention is also a method of inspecting a display device. This display device has a display panel equipped with a plurality of pixel elements, a plurality of driver circuit elements for receiving a serial image signal, converting the image signal into a parallel form, and sending the converted signal to the display panel, and a printed-wiring board including a plurality of signal output terminals for delivering the serial image signal and control signals to the driver circuit elements. The printed-wiring board further includes a plurality of dummy output terminals close to the signal output terminals. One of the dummy output terminals is electrically connected with one of the signal output terminals within the printed-wiring board. Another dummy output terminal is electrically connected with another of the signal output terminals within the printed-wiring board. An inspecting appliance is made to abut against the dummy output terminals to inspect the display device for presence or absence of flow of a signal.

In the present invention, the signal output terminals of the printed-wiring board act to supply control signals to the driver circuit elements. A dummy output terminal is mounted close to the signal output terminals. This dummy output terminal is electrically connected with one signal output terminal in the printed-wiring board. An inspecting appliance such as a probe for inspection makes contact with the dummy output terminal or against a dummy input terminal corresponding to the dummy output terminal. Thus, one can easily ascertain whether a defect in the displayed image is attributed to any one driver circuit element, to the printed-wiring board, or to other cause. Hence, the device can be repaired in a short time.

Similarly, one can easily ascertain whether a defect in the displayed image is attributed to any one driver circuit element, to the printed-wiring board, or to other cause, by causing an inspecting appliance such as a probe for inspection to make contact with the inspecting output terminal or against the inspecting input terminal corresponding to the inspecting output terminal. Consequently, the device can be repaired in a short time.

Moreover, the dummy output terminal or inspecting terminal mounted on the printed-wiring board adds to the strength with which the signal output terminals of the printed-wiring board are connected. When an external stress is applied, the possibility that the connection of the printed-wiring board is impaired is reduced.

Other objects and features of the invention will appear in the course of the description thereof, which follows.

DETAILED DESCRIPTION OF THE INVENTION

FIRST EXAMPLE

Figure 1:
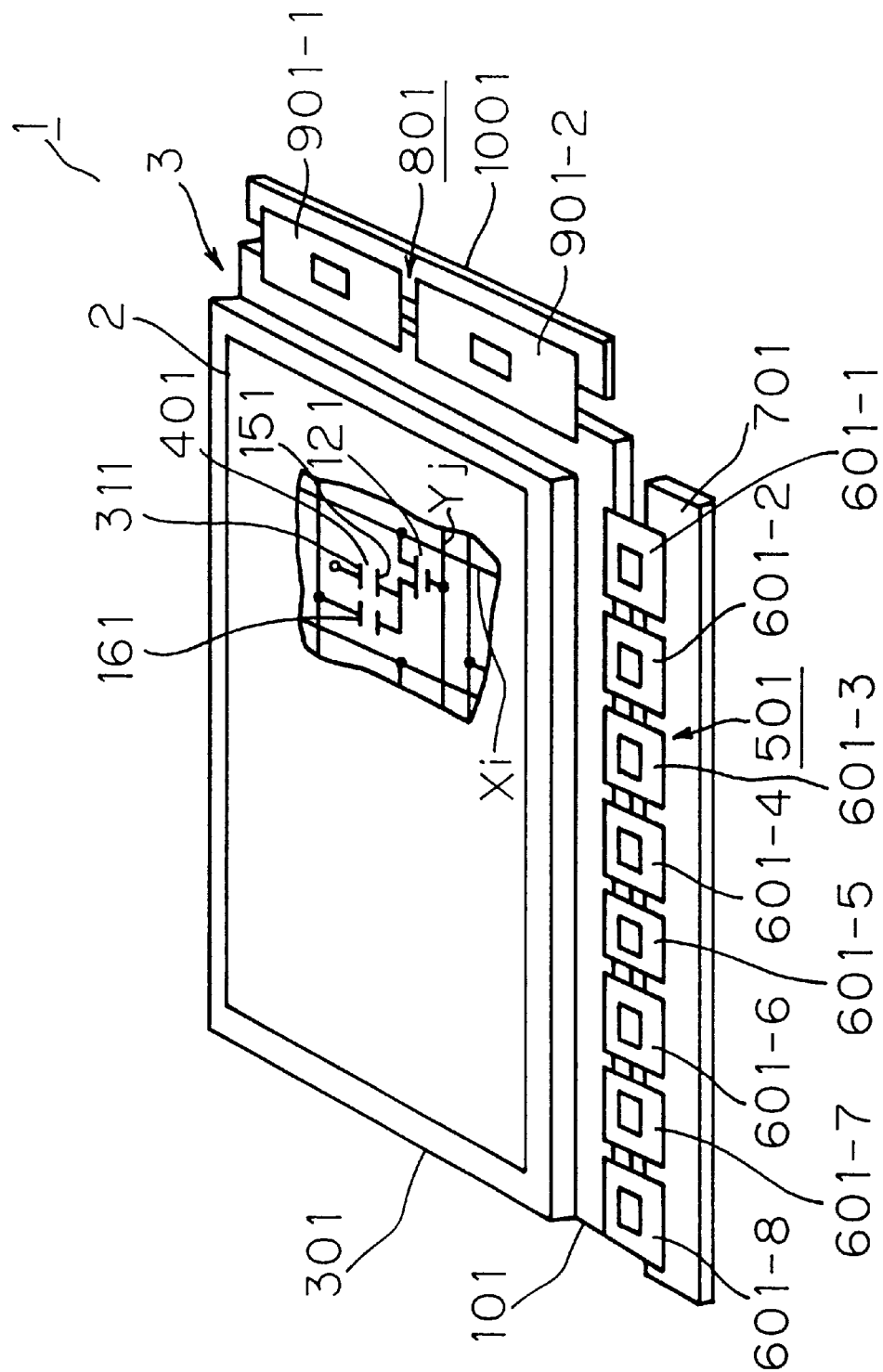
FIG. 1 is a schematic perspective view of an active matrix liquid crystal display according to the present invention.
Figure 2:
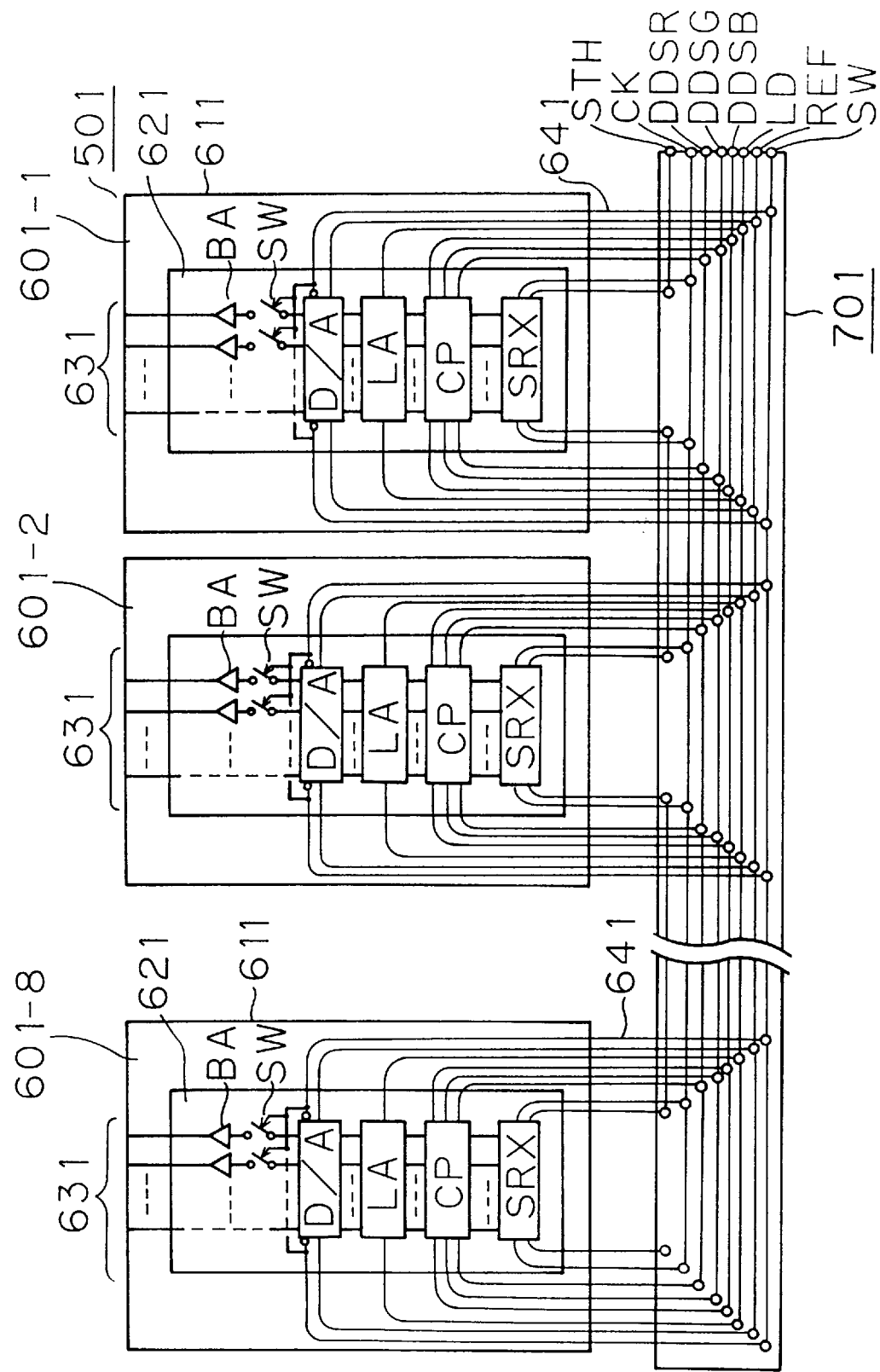
FIG. 2 is an equivalent circuit diagram of the X-driver circuit portion included in the active matrix liquid crystal display shown in FIG. 1.
Figure 3:
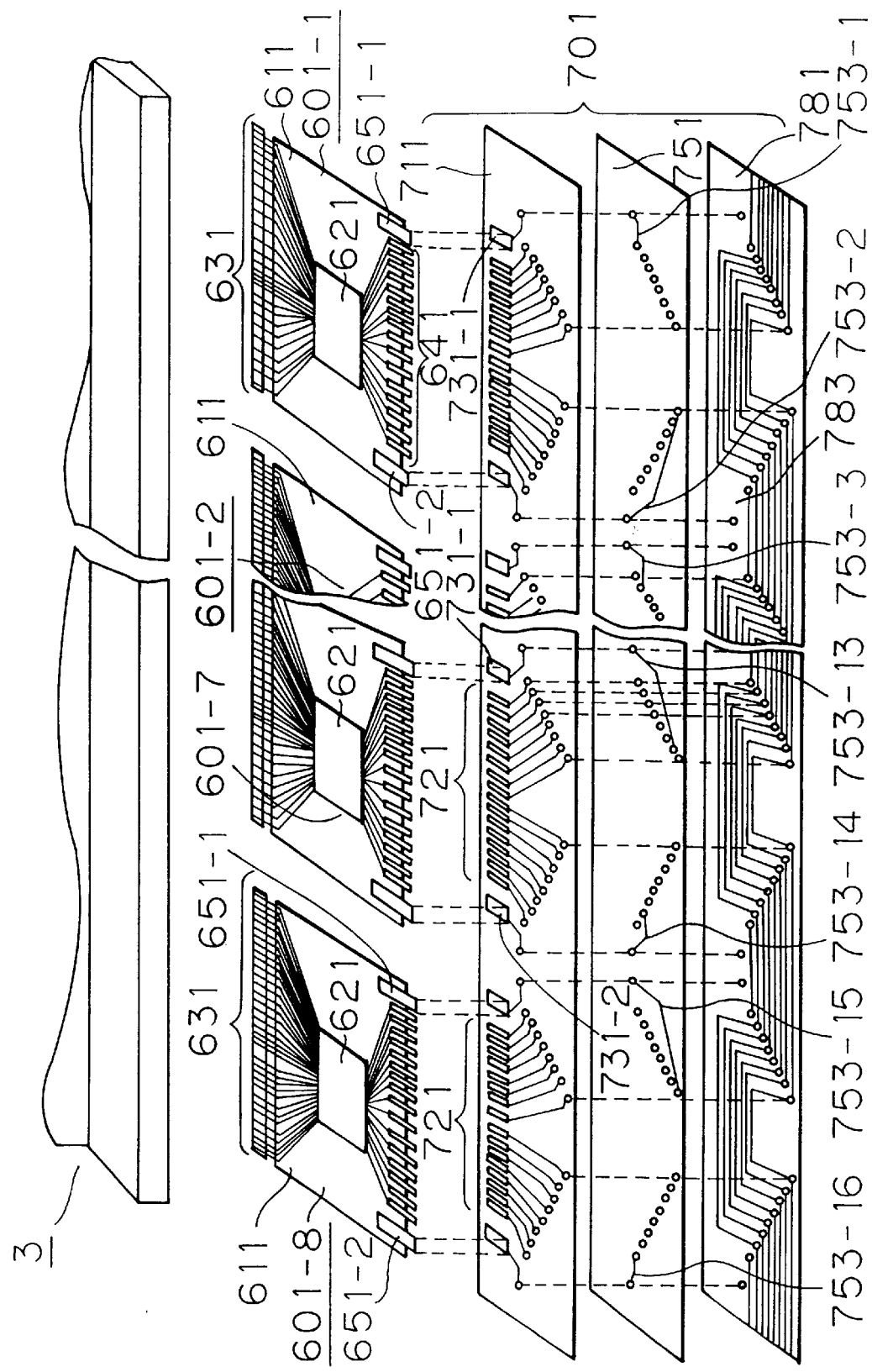
FIG. 3 is a schematic fragmentary perspective view of the X-driver circuit portion included in the active matrix liquid crystal display shown in FIG. 1.

An active matrix liquid crystal display forming the first example of the invention is next described in detail by referring to FIGS. 1–3. This liquid crystal display is a normally white mode, transmission-type liquid crystal display and is capable of acting as a color display. As shown in FIG. 1, this display is equipped with a display region 2 of 14-in. diagonal size.

A liquid crystal panel 3 forming the active matrix liquid crystal display 1 comprises an array substrate 101 and a counter substrate 301 between which a twisted-nematic liquid crystal layer 401 is held via orientation films (not shown), respectively. The liquid crystal layer 401 acts as an optical modulating layer. These components are held together with sealing material (not shown). Polarizing sheets are disposed on the outer surfaces of the substrates 101 and 301, respectively, in such a way that their axes of polarization are perpendicular to each other.

The array substrate 101 comprises 640×3 signal lines $X_i$ (i=1, 2, . . . , 1920) and 480 scanning lines $Y_j$ (j=1, 2, . . . , 480). The signal lines $X_i$ extend substantially perpendicular to the scanning lines $Y_j$. A pixel electrode 151 made from ITO (indium tin oxide) is disposed near each intersection of the signal lines $X_i$ and scanning lines $Y_j$ via an inverted-staggered field-effect transistor (TFT) 121. This TFT 121 has an active layer made of a thin film of amorphous silicon.

The array substrate 101 further includes storage capacitor lines 161 running substantially parallel to the scanning lines $Y_j$. The storage capacitor lines 161 overlap with the pixel electrodes 151. The pixel electrodes 151 cooperate with the storage capacitor lines 161 to form storage capacitors CS.

The counter substrate 301 has matrix light-blocking layers (not shown) for blocking light for the TFTs 121, the gaps between the signal lines $X_i$ and pixel electrodes 151, and the gaps between the scanning lines $Y_j$ and pixel electrodes 151 which are formed on the array substrate 101. The counter substrate 301 further includes color filter layers of the three primary colors (R, G, and B). These color filter layers are disposed between the light-blocking layers to accomplish color display. Furthermore, a counter electrode 311 consisting of ITO is deposited on the counter substrate 301. In this way, the liquid crystal panel 3 is formed.

Each horizontal pixel line of the display region 2 of the liquid crystal panel 3 contains 640 dots each consisting of three color elements (R, G, and B). There are arranged 480 such horizontal pixel lines.

In the present example, in order to reduce the outer dimension of the active matrix liquid crystal display 1, the signal lines $X_i$ and the scanning lines $Y_j$ are brought out only from one side of the liquid crystal panel 3. Each signal line $X_i$ extending from the liquid crystal panel 3 is electrically connected with an X-driver circuit portion 501. Each scanning line $Y_j$ is electrically connected with a Y-driver circuit portion 801.

The X-driver circuit portion 501 and the Y-driver circuit portion 801 are electrically connected with a control circuit portion (not shown) which supplies desired signals in response to externally applied input signals. The Y-driver circuit portion 801 has two Y-TAB chips 901-1, 901-2 and a Y printed-wiring board 1001 for supplying signals to the Y-TAB chips 901-1, 901-2.

The X-driver circuit portion 501 comprises eight X-TAB chips 601-1, 601-2, . . . , 601-8 and an X printed-wiring board 701 for supplying signals to these X-TAB chips 601-1, 601-2, 601-8.

As shown in FIGS. 2 and 3, each of the X-TAB chips 601-1, 601-2, . . . , 601-8 comprises a flexible sheet 611 on which signal line-driving ICs 621 are installed. At one end of each of these X-TAB chips 601-1, 601-2, . . . , 601-8, there are provided 240 analog image data output terminals 631 for furnishing analog image data. At the other end, 16 data terminals 641 comprising 14 data input terminals, one data input terminal for receiving a horizontal start signal (STH), and one data output terminal for sending the horizontal start signal (STH) to the next stage of X-TAB chip 601-n are provided. The 14 data input terminals receive 6-bit digital image data (DDSR), (DDSG), and (DDSB) for R, G, and B, respectively, a horizontal clock signal (CKH), a loading signal (LD), a reference voltage (REF), and a horizontal output signal (SW).

As shown in FIG. 3, each of the X-TAB chips 601-1, 601-2, . . . , 601-8 has a pair of large-area dummy terminals 651-1 and 651-2 on opposite sides of the 16 data terminals 641 to prevent disconnection of the X-TAB chips 601-1, 601-2, . . . , 601-8 from the X printed-wiring board 701. These dummy terminals are larger in width and length than the data terminals 641.

The dummy terminals 651-1 and 651-2 of the present example are used for inspection as described later, as well as for preventing disconnection, unlike the dummy terminals already described in the description of the prior art techniques. Therefore, the dummy terminals 651-1 and 651-2 can be referred to as inspecting terminals.

The data terminals 641 are about 0.3–0.4 mm wide. The pitch between the 16 successive data terminals 641 is approximately 0.5 mm. The width of the dummy terminals 651-1 and 651-2 is about 1 to 3 mm. In this way, the dummy terminals 651-1 and 651-2 are made larger than the data terminals 641 to facilitate bringing an inspecting probe into contact with these dummy terminals.

The signal line-driving ICs 621 forming the X-TAB chips 601-1, 601-2, . . . , 601-8 have the following circuits as shown in FIG. 2; (1) 240 stages of shift register circuits (SRX) for producing the horizontal start signal (STH) from each successive following stage in response to the horizontal clock signal (CKH); (2) a serial-to-parallel converter circuit (CP) for selecting and holding the 6-bit digital data (DDSR), (DDSG), and (DDSB) entered in a parallel form for each of the R, G, and B in response to the outputs from the stages of shift register circuits (SRX); (3) a latch (LA) equipped with a memory for storing 6-bit digital image data (240 dots×6 bits) transferred from the serial-to-parallel converter circuit (CP) according to the loading signal (LD); (4) a digital-to-analog converter circuit (D/A) for converting the three sets of the 6-bit digital image data from the latch (LA) into analog form to create an analog image signal; (5) a switch circuit (SW) for synchronizing the timing at which the analog image signals are produced from the digital-to-analog converter circuit (D/A); and (6) a buffer circuit (BA) for amplifying the output from the switch circuit (SW).

The X printed-wiring board 701 is next described in detail. As shown in FIG. 2, this board 701 is so designed that the externally applied 6-bit digital data (DDSR), (DDSG), and (DDSB) entered in a parallel form for each of the R, G, and B, the horizontal start signal (STH), the horizontal clock signal (CKH), the loading signal (LD), and the reference voltage (REF) are entered into the eight X-TAB chips 601-1, 601-2, . . . , 601-8, respectively, in parallel. The horizontal start signal (STH) is successively applied to the X-TAB chips 601-1, 601-2, . . . , 601-8.

As shown in FIG. 3, the X printed-wiring board 701 is composed of a rigid multilayer board and has a surface-layer sheet 711. The surface-layer sheet 711 has 16 data pads 721 corresponding to the data terminal 641 of the X-TAB chips 601-1, 601-2, . . . , 601-8, respectively, and 8 pairs of dummy pads 731-1, 731-2 corresponding to the X-TAB chips 601-1, 601-2, . . . , 601-8. The dummy pads 731-1 and 731-2 are larger in area than the data pads 721. In this example, the X printed-wiring board 701 is composed of a rigid multilayer board as mentioned previously. The board 701 may also be made of a flexible sheet. The X printed-wiring board 701 further includes a second board 781 on which 8 data interconnections 783 are arranged. The data interconnections 783 are so laid that the externally applied 6-bit digital data (DDSR), (DDSG), and (DDSB) entered in a parallel form for each of the R, G, and B, respectively, the horizontal start signal (STH), the horizontal clock signal (CKH), the loading signal (LD), and the reference voltage (REF) are entered into the eight X-TAB chips 601-1, 601-2, . . . , 601-8, respectively, in parallel. The data interconnections 783 also act to transmit the horizontal start signal (STH) to the X-TAB chips successively from the X-TAB chip 601-1 to the X-TAB chip 601-8. The data interconnections 783 on the second board 781 are electrically connected with the surface-layer sheet 711 via a first sheet 751.

The first sheet 751 is mounted between the surface layer sheet 711 of the X printed-wiring board 701 and the second board 781, and is equipped with interconnections 753-1, . . . , 753-16 for electrically connecting the dummy pads 731-1, 731-2 located on the surface-layer sheet 711 with one of the data interconnections 783. For instance, the dummy pad 731-1 corresponding to the dummy terminal 651-1 of the X-TAB chip 601-1 is electrically connected via the interconnection 753-1 with that of the data interconnections 783 which transmits the horizontal start signal (STH). The dummy pad 731-2 corresponding to the dummy terminal 651-2 of the X-TAB chip 601-1 is connected via the interconnection 753-2 with that of the data interconnections 783 which transmits the horizontal clock signal (CKH). The dummy pad 731-1 corresponding to the dummy terminal 651-1 of the X-TAB chip 601-2 is connected via the interconnection 753-3 with that of the data interconnections 783 which transmits the digital image data (DDSR).

Similarly, the dummy pad 731-2 corresponding to the dummy terminal 651-2 of the X-TAB chip 601-8 is connected via the interconnection 753-3 with that of the data interconnections 783 which transmits the horizontal start signal (STH).

The data terminals 641 of the X-TAB chips 601-1, 601-2, . . . , 601-8 and the dummy terminals 651-1, 651-2 are electrically connected with their respective data pads 721 and dummy pads 731-1, 731-2 of the X printed-wiring board 701 via an anisotropic conductive film (not shown). The analog image data output terminals 631 of the X-TAB chips 601-1, 601-2, . . . , 601-8 are electrically connected with their respective signal lines $X_i$ of the liquid crystal panel 3 via an anisotropic conductive film (not shown).

In the above-described structure, the X-TAB chips 601-1, 601-2, . . . , 601-8 are connected with the X printed-wiring board 701 not only because the data terminals 641 of the X-TAB chip 601 are connected with the data pads 721 of the X printed-wiring board 701 but also because the dummy terminals 651-1, 651-2 are connected with the dummy pads 731-1, 731-2 of the X printed-wiring board 701. Therefore, a break in connection is unlikely to occur, even if an external stress is applied. Especially, the dummy terminals 651-1, 651-2 of the X-TAB chips 601-1, 601-2, . . . , 601-8 are disposed on the opposite sides of the data terminals 641 in which the stress tends to concentrate. Furthermore, the dummy terminals are sufficiently wider than the data terminals 641. Hence, a break in connection is unlikely to occur. Because of the structure described thus far, an inspection can be performed easily in the manner described below without providing any special inspecting pads or the like.

If a defect is present in the image displayed on the active matrix liquid crystal display 1, a probe (not shown) makes contact with the dummy terminals 651-1, 651-2 of the X-TAB chips 601-1, 601-2, . . . , 601-8 successively to see if desired signals are being supplied.

For example, if the desired horizontal start signal (STH) is not detected from the dummy terminal 651-1 of the X-TAB chip 601-1 though the desired signal is being supplied to the X printed-wiring board 701, then one can judge that the defect is attributed to a defect in the interconnections in the X printed-wiring board 701. The liquid crystal display 1 can be repaired by exchanging the X printed-wiring board 701.

If the desired horizontal clock signal (CKH) is not detected from the dummy terminal 651-2 of the X-TAB chip 601-1 though the desired signal is being fed to the X printed-wiring board 701, then one can again judge that the defect is due to a defect in the interconnections in the X printed-wiring board 701. Then, the liquid crystal display 1 can be repaired by replacing the X printed-wiring board 701. In this way, the probe can make contact with the dummy terminals 651-1 and 651-2 of the X-TAB chips 601-1, 601-2, . . . , 601-8 successively, and signals are detected. In this manner, one can ascertain whether the defect in the displayed image arises from the X printed-wiring board 701.

If the desired signal is furnished to the X printed-wiring board 701, and if the desired signal is detected from the dummy terminals 651-1 and 651-2 of the X-TAB chips 601-1, 601-2, . . . , 601-8, then one can consider that the defect in the displayed image is due to faulty connection of the X printed-wiring board 701 with the X-TAB chips 601-1, 601-2, . . . , 601-8 or due to the X-TAB chips 601-1, 601-2, . . . , 601-8. The active matrix liquid crystal display 1 can be readily repaired by exchanging the X-TAB chips 601-1, 601-2, 601-8.

In the present example, the following inspection can also be performed. The X printed-wiring board 701 can be inspected for defects without needing any special inspection pads or the like on the X printed-wiring board 701 by previously bringing the probe or the like into abutting engagement with the dummy pads 731-1, 731-2 of the X printed-wiring board 701. Consequently, if the X printed-wiring board 701 is faulty, it can be prevented from being subjected to the manufacturing process. That is, various signals are supplied from both ends of the X printed-wiring board 701. A check is made as to whether the desired output is obtained from the dummy pads 731-1, 731-2. In this way, the X printed-wiring board 701 can be easily inspected. While the X-TAB chips 601-1, 601-2, . . . , 601-8 and the X printed-wiring board 701 have been described thus far, Y-TAB chips and the Y printed-wiring board can be constructed similarly and thus will not be described below.

SECOND EXAMPLE

Figure 4:
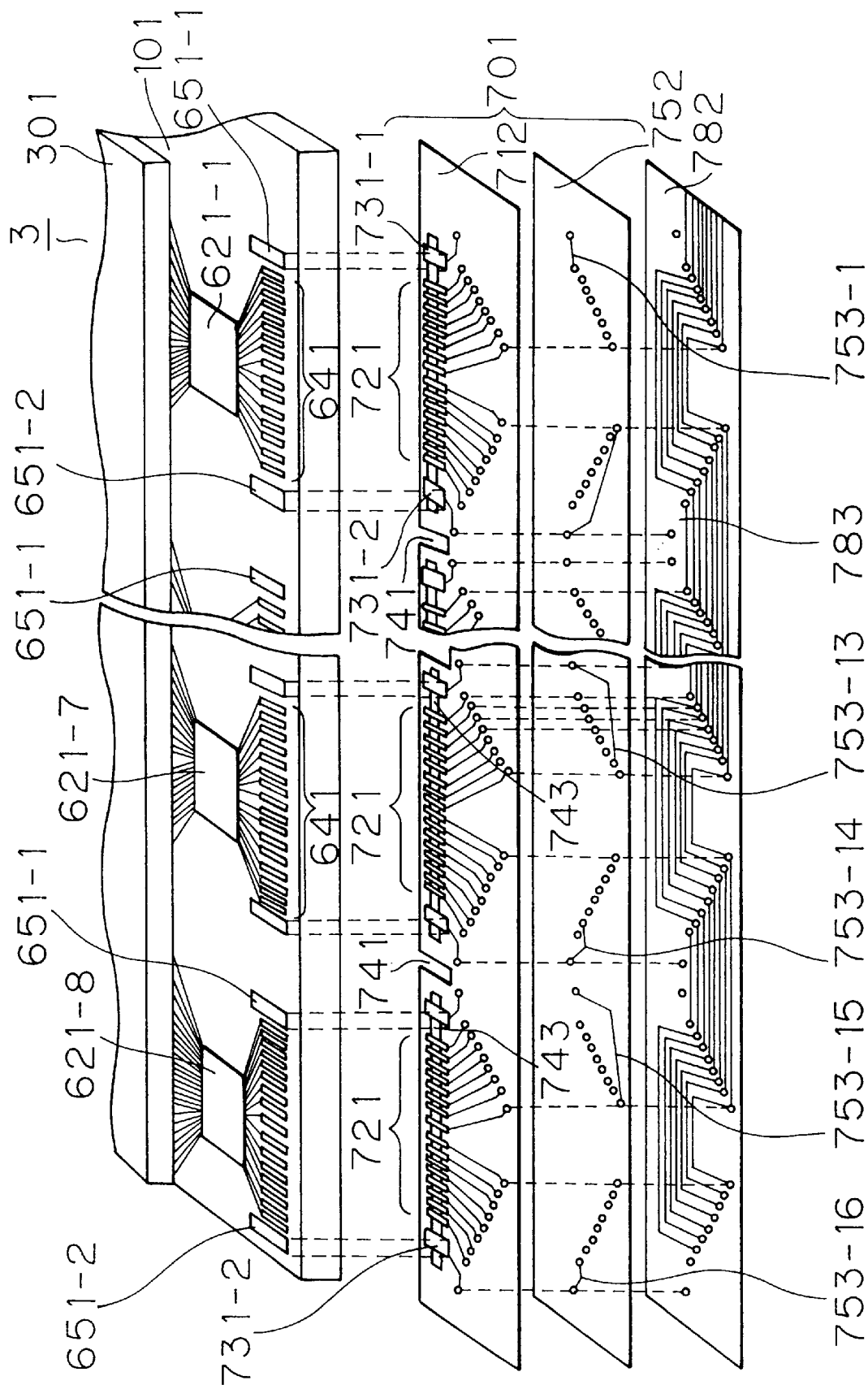
FIG. 4 is a schematic fragmentary perspective view of an X-driver circuit portion included in another active matrix liquid crystal display according to the invention.

A second example of the invention is next described by referring to FIG. 4. In this example, 8 signal line-driving ICs 621-1, 621-2, . . . , 621-8 are packed on an array substrate 101 of a liquid crystal panel 3. The signal line-driving ICs 621-1, 621-2, . . . , 621-8 have 240 analog image data output pins (not shown) which are electrically connected with the signal lines $X_i$ via an anisotropic conductive film. The ICs 621-1, 621-2, . . . , 621-8 further include 14 input pins for receiving 6-bit digital data (DDSR), (DDSG), and (DDSB) for the R, G, and B, respectively, a horizontal start signal (STH), a horizontal clock signal (CKH), a loading signal (LD), a reference voltage (REF), and a horizontal output signal (SW), an input pin for receiving a horizontal start signal (STH), and an output pin for sending the horizontal start signal (STH) to the next stage of X-TAB chip 601. These input and output pins are electrically connected via an anisotropic conductive film with 16 data terminals 641 disposed on the array substrate 101.

In order to prevent a break in connection with the X printed-wiring board 701, a pair of dummy terminals 651-1 and 651-2 larger than the data terminals 641 are installed on the array substrate 101 and located on opposite sides of the 16 data terminals 641.

This X printed-wiring board 701 is a multilayer film including a flexible surface-layer film 712, a first layer film 752, and a second layer film 782. The surface-layer film 712 has slits 741 for partitioning the film into regions corresponding to the signal line-driving ICs 621-1, 621-2, . . . , 621-8, respectively, 16 data pads 721 corresponding to the signal line-driving ICs 621-1, 621-2, . . . , 621-8, respectively, a pair of dummy pads 731-1, 731-2 larger than the data pads 721, and windows 743 for permitting electrical connection of the dummy pads 731-1, 731-2 with the data terminals 721 and the dummy terminals 651-1 and 651-2 positioned on the array substrate 101. The X printed-wiring board 701 is similar to the X printed-wiring board 701 of the first example in other respects.

In the above-described structure, the liquid crystal panel 3 is connected with the X printed-wiring board 701 not only because the data terminals 641 of the panel 3 are connected with the data pads 721 of the X printed-wiring board 701 but also because the dummy terminals 651-1, 651-2 are connected with the dummy pads 731-1, 731-2 of the X printed-wiring board 701. Therefore, a break in connection is unlikely to occur, even if an external stress is applied. Because of the structure described thus far, inspection and repair can be performed easily without providing any special inspection pads or the like, in the same way as in the first example.

If a defect is present in the image displayed on the active matrix liquid crystal display 1, a probe (not shown) can make contact with dummy terminals 731-1 and 731-2, successively, of the X printed-wiring board 701 to see if desired signals are detected.

If the desired horizontal start signal (STH) is not detected from the dummy pad 731-1 though the desired signal is being fed to the X printed-wiring board 701, then one can judge that the defect is due to a defect in the interconnections on the X printed-wiring board 701. As such, the liquid crystal display 1 can be repaired by replacing the X printed-wiring board 701. Similarly, if the desired horizontal clock signal (CKH) is not detected from the dummy pad 731-2 though the desired signal is being fed to the X printed-wiring board 701, then one can again judge that the defect is due to a defect in the interconnections on the X printed-wiring board 701. Then, the liquid crystal display 1 can be repaired by replacing the X printed-wiring board 701. The probe is caused to bear against the dummy pads 731-1 and 731-2, successively, of the X printed-wiring board 701 and signals are detected. In this manner, one can ascertain whether the defect in the displayed image arises from the X printed-wiring board 701.

If the desired signal is furnished to the X printed-wiring board 701, and if the desired signal is detected from the dummy pads 731-1 and 731-2, then one can consider that the defect in the displayed image is due to imperfect connection of the X printed-wiring board 701 with the liquid crystal panel 3 or due to the signal line-driving ICs 621-1, 621-2, . . . , 621-8. The active matrix liquid crystal display 1 can be readily repaired by exchanging the signal line-driving ICs 621-1, 621-2, . . . , 621-8.

In the present example, the following inspection can also be performed. The X printed-wiring board 701 can be inspected for defects without needing any special inspection pads or the like on the X printed-wiring board 701 by previously bringing the probe or the like into contact with the dummy pads 731-1, 731-2 of the X printed-wiring board 701. Consequently, if the X printed-wiring board 701 is at fault, it can be prevented from being subjected to the manufacturing process without increasing the size of the device. This example can be made up of a less number of components than the first example.

In this way, in the above examples of active matrix liquid crystal display, the possibility of a break in connection of the liquid crystal display with driver circuits can be reduced. The device is more resistant to external shock. Moreover, the cause of a defect in the active matrix liquid crystal display can be relatively easily found without adding any special inspection pads to the driver circuits or the like. Hence, the device can be repaired in a short time. In addition, completed printed-wiring boards can be inspected without providing any special inspection pads. In consequence, introduction of faulty printed-wiring boards in the manufacturing process can be effectively prevented.

MODIFIED EXAMPLES

In the above examples, the dummy terminals 651-1 and 651-2 are arranged along the rows of the data terminals 641 at opposite sides of the 16 data terminals 641. Both of these dummy terminals are used for inspection. The present invention is not limited to this structure. For example, only one of the dummy terminals 651-1 and 651-2 may be used for inspection.

In FIG. 3, the front ends of the dummy terminals 651-1 and 651-2 assume a rectangular form. The front ends may be shaped into any desired form, such as circular and elliptical forms, as long as it facilitates bringing the probe into contact with the terminals.

Moreover, the dummy terminals 651-1 and 651-2 may be positioned between the 16 data terminals 641.

What is claimed is:

1. A display device, for displaying an image, comprising:

a display panel having a plurality of pixel elements;

a plurality of driver circuit elements for receiving a serial image signal and control signals, converting the serial image signal into a parallel form based on the control signals, and sending the converted signal to said display panel; and an electrical wiring member, including a plurality of electrical wiring lines for delivering the serial image signal and control signals and a plurality of output terminal groups corresponding to each of the driver circuit elements, each of the output terminal groups including a plurality of signal output terminals, and each of the signal output terminals being electrically connected to one of the electrical wiring lines for outputting the serial image signal and control signals to said driver circuit elements, wherein said electrical wiring member includes a first and second inspecting output terminal for determining defects in any one of said driver circuit elements and said electrical wiring lines, said first and second inspecting output terminals being different from said signal output terminals and constructed larger than said signal output terminals to provide increased accessibility and enhanced connection strength thereto, the first inspecting output terminal disposed close to one of the signal output terminals and electrically connected to a first one of the signal output terminals, and the second inspecting output terminal disposed close to another one of the signal output terminals and electrically connected to a second one of the output terminals, said second one of the output terminals being different from said first one of the output terminals.

2. A display device, for displaying an image, comprising:

a display panel having a plurality of pixel elements;

a plurality of driver circuit elements, including a plurality of signal receiving pads for receiving a serial image signal and control signals, for converting the serial image signal into a parallel form based on the control signals and for sending the converted signal to said display panel; and an electrical wiring member, including a plurality of electrical wiring lines for delivering the serial image signal and control signals, and a plurality of output terminal groups corresponding to each of the driver circuit elements, each of the output terminal groups including a plurality of signal output terminals corresponding to the signal receiving pads, and each of the signal output terminals being electrically connected to one of the electrical wiring lines for outputting the serial image signal and control signals to said driver circuit elements, wherein a first one of the driver circuit elements includes a first inspecting signal receiving pad, a second one of the driver circuit elements includes a second inspecting signal receiving pad, and the electrical wiring member includes a first and second inspecting output terminal for determining defects in any one of said display panel, said driver circuit elements, and said electrical wiring lines, the first and second inspecting output terminals being different from said signal output terminals and constructed larger than said signal output terminals to provide increased accessibility and enhanced coupling strength thereto, said first and second inspecting output terminals being mechanically coupled to the first and second signal receiving pads, respectively, and electrically connected to a first one and a second one of said wiring lines, respectively.

3. The device according to claim 1 or 2, wherein the signal output terminals are disposed in a linear array and provides a signal output terminal group with a first test terminal and a second test terminal at opposite sides of said group.

4. The device according to claim 3, wherein said electrical wiring member includes a printed wiring board.

5. The device according to claim 1 or 2, wherein said electrical wiring member includes a printed wiring board.

6. The display device of claim 5, wherein said driver circuit elements comprise driving ICs installed on a flexible sheet and have signal input terminals corresponding to said signal output terminals of said printed-wiring board and inspecting input terminals corresponding to said inspecting output terminals.

7. The display device of claim 5, wherein said driver circuit elements comprise driving ICs installed on a plurality of flexible sheets arranged along one side of said display panel, and wherein said inspecting output terminals are located between sides of said signal output terminals and their respective adjacent ones of said flexible sheets.

8. The display device of claim 5, wherein said driver circuit elements are installed on said display panel, and wherein said display panel has signal input terminals corresponding to said signal output terminals of said printed-wiring board and inspecting input terminals corresponding to said inspecting output terminals.

9. The display device of claim 5, wherein said driver circuit elements are installed on said display panel and arranged along one side of said display panel, and wherein said inspecting output terminals are located between sides of said signal output terminals and their respective adjacent ones of said signal output terminals of said driver circuit elements.

10. A display device, for displaying an image, comprising:
a display panel having a plurality of pixel elements;
a plurality of driver circuit elements for receiving control signals, and sending scanning pulses to said display panel; and
an electrical wiring member, including a plurality of electrical wiring lines for delivering a serial image signal and control signals, and a plurality of output terminal groups corresponding to each of the driver circuit elements, each of the output terminal groups including a plurality of signal output terminals, and each of the signal output terminals being electrically connected to one of the electrical wiring lines for outputting the serial image signal and control signals to said driver circuit elements, wherein said electrical wiring member includes a first and second inspecting output terminal for determining defects in any one of said driver circuit elements and said electrical wiring lines, said first and second inspecting output terminals being different from said signal output terminals and constructed larger than said signal output terminals to provide increased accessibility and enhanced connection strength thereto, the first inspecting output terminal disposed close to one of the signal output terminals and electrically connected to a first one of the signal output terminals, and the second inspecting output terminal disposed close to another one of the signal output terminals and electrically connected to a second one of the output terminals, said second one of the output terminals being different from said first one of the output terminals.

11. A display device, for displaying an image, comprising:
a display panel having a plurality of pixel elements;
a plurality of driver circuit elements including a plurality of signal receiving pads for receiving control signals, and sending scanning pulses to said display panel; and
an electrical wiring member, including a plurality of electrical wiring lines for delivering the control signals, and a plurality of output terminal groups corresponding to each of the driver circuit elements, each of the output terminal groups including a plurality of signal output terminals corresponding to the signal receiving pads, and each of the signal output terminals being electrically connected to one of the electrical wiring lines for outputting the control signals to said driver circuit elements, wherein a first one of the driver circuit elements includes a first inspecting signal receiving pad, a second one of the driver circuit elements includes a second inspecting signal receiving pad, and the electrical wiring member includes a first and second inspecting output terminal for determining defects in any one of said driver circuit elements and said electrical wiring lines, the first and second inspecting output terminals being different from said signal output terminals and constructed larger than said signal output terminals to provide increased accessibility and enhanced coupling strength thereto, said first and second inspecting output terminals being mechanically coupled to the first and second signal receiving pads, respectively, and the first and second inspecting output terminals being electrically connected to a first and second one of said wiring lines, respectively.

12. The device according to claim 10 or 11, wherein the signal output terminals are in a linear array and provide a signal output terminal group with first and second test terminals at opposite sides thereof.

13. The device according to claim 12, wherein said electrical wiring member includes a printed wiring board.

14. The device according to claim 10 or 11, wherein said electrical wiring member includes a printed wiring board.

15. The display device of claim 14, wherein said driver circuit elements comprise driving ICs installed on a flexible sheet and have signal input terminals corresponding to said signal output terminals of said printed-wiring board and inspecting input terminals corresponding to said inspecting output terminals.

16. The display device of claim 14, wherein said driver circuit elements comprise driving ICs installed on a plurality of flexible sheets arranged along one side of said display panel, and wherein said inspecting output terminals are located between sides of said signal output terminals and their respective adjacent ones of said flexible sheets.

17. The display device of claim 14, wherein said driver circuit elements are installed on said display panel and have signal input terminals corresponding to said signal output terminals of said printed-wiring board and inspecting input terminals corresponding to said inspecting output terminals.

18. The display device of claim 14, wherein said driver circuit elements are installed on said display panel and arranged along one side of said display panel, and wherein said inspecting output terminals are located between sides of said signal output terminals and their respective adjacent ones of said signal output terminals of said driver circuit elements.

* * * * *